United States Patent [19]
Nakashiba

[11] Patent Number: 5,796,801
[45] Date of Patent: Aug. 18, 1998

[54] CHARGE COUPLED DEVICE WITH HIGH CHARGE TRANSFER EFFICIENCY

[75] Inventor: Yasutaka Nakashiba, Tokyo, Japan

[73] Assignee: NEC Corporation, Tokyo, Japan

[21] Appl. No.: 655,910

[22] Filed: May 31, 1996

[30] Foreign Application Priority Data

May 31, 1995 [JP] Japan ................................ 7-133151

[51] Int. Cl.⁶ .......................... G11C 19/28; H01L 29/768
[52] U.S. Cl. .......................... 377/60; 257/221; 257/239; 257/248; 257/250
[58] Field of Search .......................... 257/221, 239, 257/247, 248, 250; 377/60

[56] References Cited

U.S. PATENT DOCUMENTS

| | | | |
|---|---|---|---|
| 4,178,519 | 12/1979 | Engeler et al. | 257/239 |
| 4,896,340 | 1/1990 | Caro | 377/60 |
| 5,065,203 | 11/1991 | Yang et al. | 257/221 |
| 5,103,278 | 4/1992 | Miwada | 377/60 |
| 5,286,989 | 2/1994 | Yonemoto | 257/239 |
| 5,521,405 | 5/1996 | Nakashiba | 257/248 |
| 5,539,226 | 7/1996 | Kawamoto et al. | 257/239 |

*Primary Examiner*—Gene M. Munson
*Attorney, Agent, or Firm*—Sughrue, Mion, Zinn, Macpeak & Seas, PLLC

[57] ABSTRACT

In a charge coupled device including a semiconductor substrate having a semiconductor region, a plurality of nonactive barrier electrodes, a plurality of first electrodes and a plurality of second electrodes arranged between the nonactive barrier electrodes, an outermost one of the nonactive barrier electrodes is electrically isolated from the others of the nonactive barrier electrodes.

10 Claims, 10 Drawing Sheets

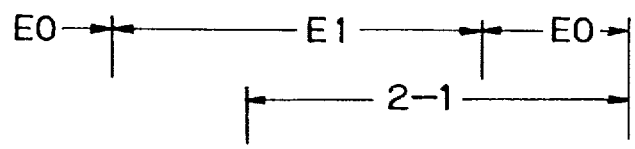
Fig. 4A
PRIOR ART
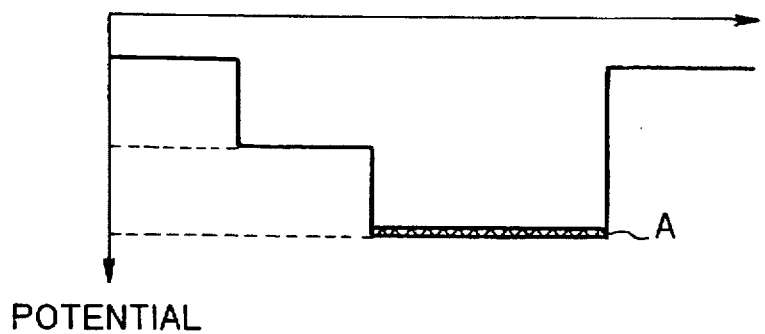
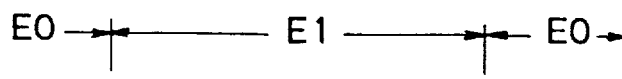
Fig. 4B
PRIOR ART
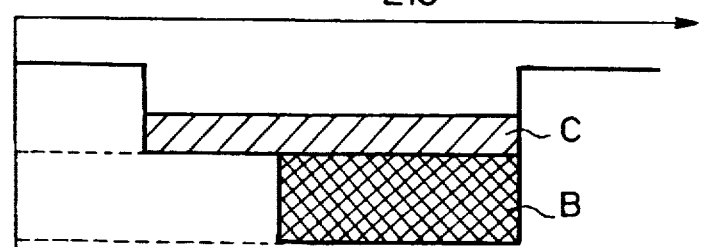

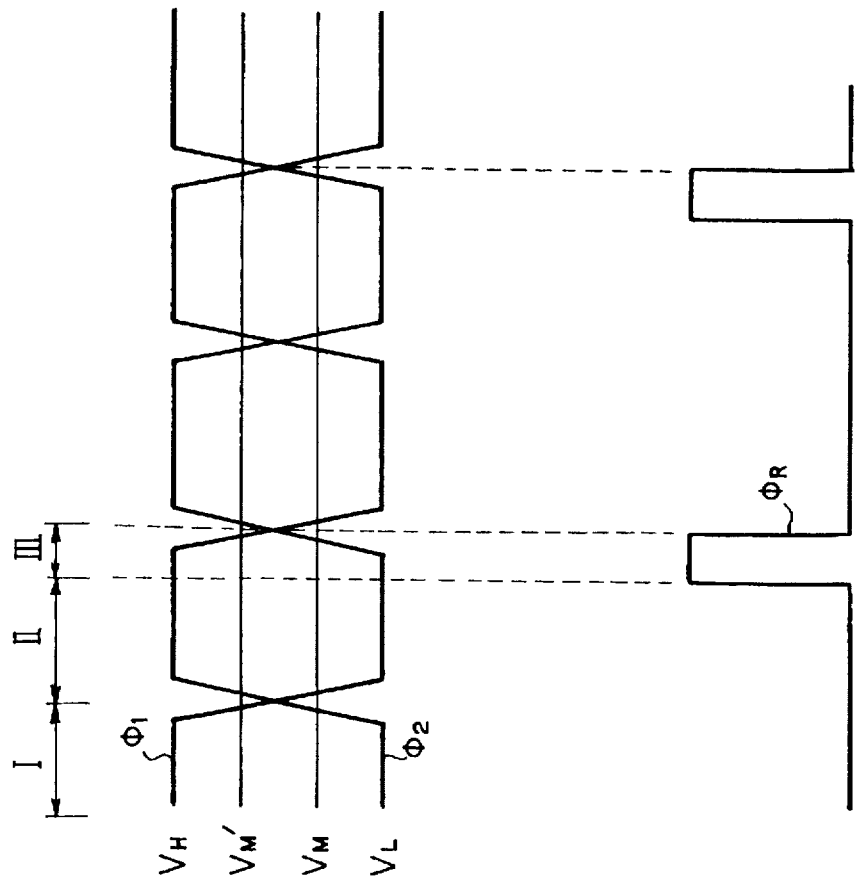

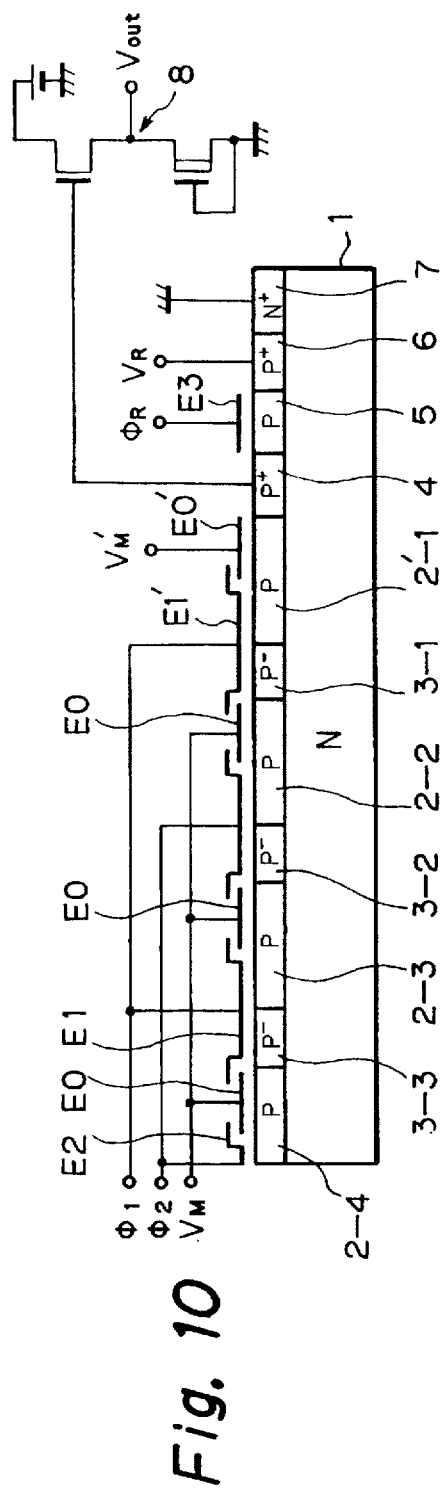
Fig. 10
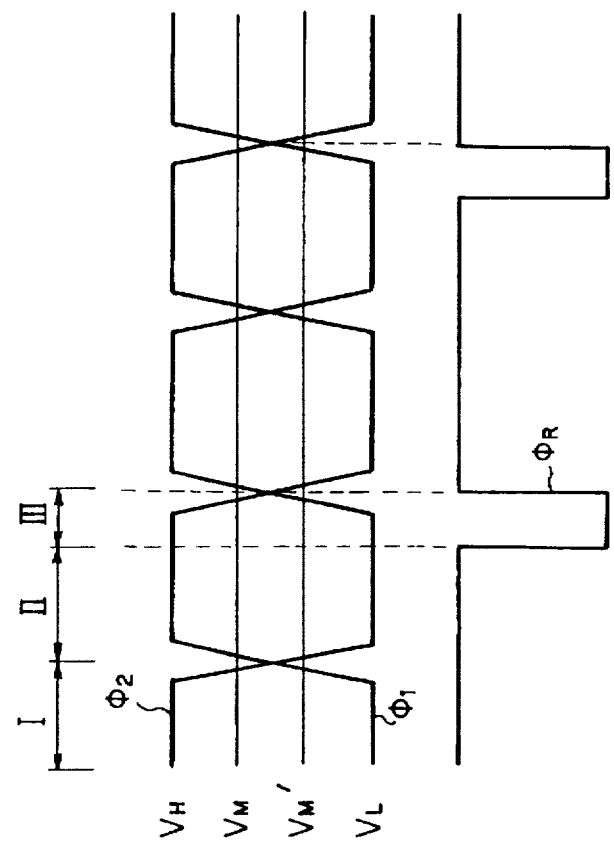
Fig. 11A
Fig. 11B

1

CHARGE COUPLED DEVICE WITH HIGH CHARGE TRANSFER EFFICIENCY

BACKGROUND OF THE INVENTION

1. Field of the Invention

The present invention relates to a charge coupled device.

2. Description of the Related Art

A prior art charge coupled device includes a semiconductor substrate having a semiconductor region, a plurality of nonactive barrier electrodes, a plurality of first electrodes and a plurality of second electrodes arranged between the nonactive barrier electrodes. Also, a floating diffusion region is provided as an output portion (see: JP-A-6-314706). This will be explained later in detail.

In the above-described prior art charge coupled device, however, the width of the floating diffusion region is smaller than the width of the semiconductor region, to enhance the sensitivity of detection of signal charge. Further, in order to obtain a full amount of signal charge in the direction of the signal flow, the outermost one of the first electrodes is long. As a result, the efficiency of transfer of charge in the direction of the signal flow is reduced.

SUMMARY OF THE INVENTION

It is an object of the present invention to provide a charge coupled device having a high charge transfer efficiency.

According to the present invention, in a charge coupled device including a semiconductor substrate having a semiconductor region, a plurality of nonactive barrier electrodes, a plurality of first electrodes and a plurality of second electrodes arranged between the nonactive barrier electrodes, an outermost one of the nonactive barrier electrodes is electrically isolated from the others of the nonactive barrier electrodes. When a first voltage is applied to the outermost nonactive barrier electrode and a second voltage different from the first voltage is applied to the other nonactive barrier electrode, the direction of transfer of signal charge is clearly determined.

BRIEF DESCRIPTION OF THE DRAWINGS

The present invention will be more clearly understood from the description as set forth below, as compared with the prior art, with reference to the accompanying drawings, wherein:

FIGS. 4A and 4B are enlarged potential diagrams of FIG. 3A;

FIGS. 6A and 6B are timing diagrams showing the voltages applied to the device of FIGS. 5A and 5B;

FIG. 10 is a cross-sectional view illustrating another modification of the device of FIG. 5A; and FIGS. 11A and 11B are timing diagrams showing the voltages applied to the device of FIG. 10.

DESCRIPTION OF THE PREFERRED EMBODIMENTS

Before the description of the preferred embodiment, a prior art charge coupled device will be explained with reference to FIGS. 1A, 1B, 2A, 2B, 3A, 3B, 3C, 4A and 4B.

Figures 1A, 1B:
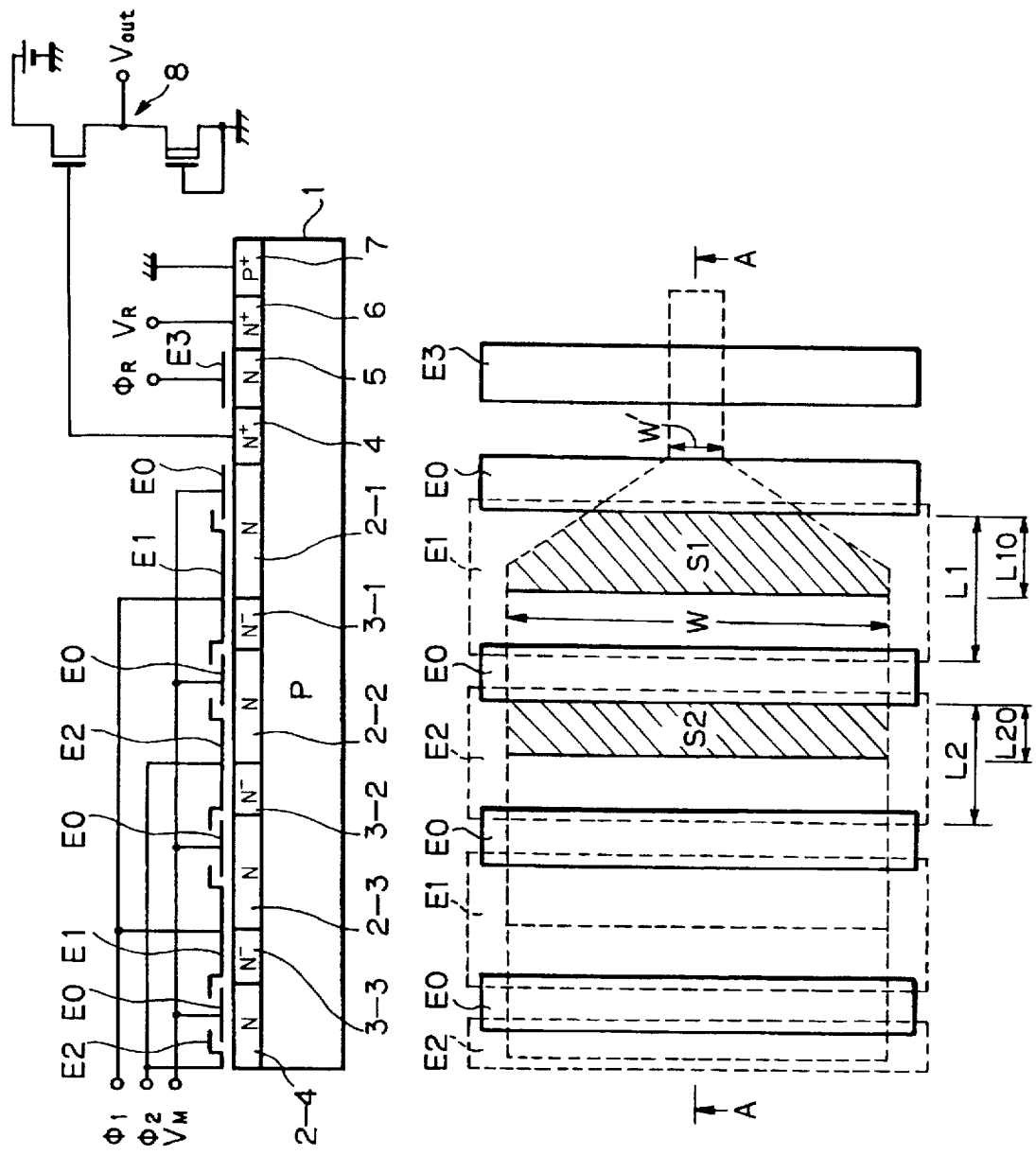
FIG. 1A is a cross-sectional view illustrating a prior art charge coupled device.
FIG. 1B is a plan view of the device of FIG. 1A.

FIG. 1A is a cross-sectional view illustrating a prior art buried channel charge coupled device, and FIG. 1B is a plan view of FIG. 1A. Note that FIG. 1A is a cross-sectional view taken along the line A—A of FIG. 1B (see: JP-A-6-314706).

In FIG. 1A, reference numeral 1 designates a P-type semiconductor substrate on which N-type semiconductor regions 2-1, 2-2, . . . , and $N^-$-type semiconductor regions 3-1, 3-2, . . . therebetween are formed. Also, an $N^+$-type semiconductor region 4 is formed as a floating diffusion region on the semiconductor substrate 1 adjacent to the outermost N-type semiconductor region 2-1. Further, an N-type semiconductor region 5, an $N^+$-type semiconductor region 6 for receiving a reference voltage $V_R$, and a grounded $P^+$-type semiconductor region 7 serving as an isolation region are formed on the semiconductor substrate 1. Note that the floating diffusion region 4 is connected to a source follower 8 which generates an output voltage $V_{out}$.

As illustrated in FIGS. 1A and 1B, electrodes E0 for receiving a constant voltage $V_M$ are formed via an insulating layer (not shown) on half of each of the N-type semiconductor regions 2-1, 2-2, . . . . Also, electrodes E1 for receiving a pulse voltage $\phi_1$, are formed via an insulating layer (not shown) on half of each of the N-type semiconductor regions 2-1, 2-3, . . . and on the $N^-$-type semiconductor regions 3-1, 3-3, . . . . Further electrodes E2 for receiving a pulse voltage $\phi_2$ are formed via an insulating layer (not shown) on half of each of the N-type semiconductor regions 2-2, 2-4, . . . and on the $N^-$-type semiconductor regions 3-2, 3-4, . . . . Further, an electrode E3 for receiving a reset voltage $\phi_R$ is formed via an insulating layer (not shown) on the N-type semiconductor region 4.

The operation of the buried channel charge coupled device of FIGS. 1A and 1B is explained with reference to FIGS. 2A and 2B and FIGS. 3A, 3B and 3C.

Figures 2A, 2B:
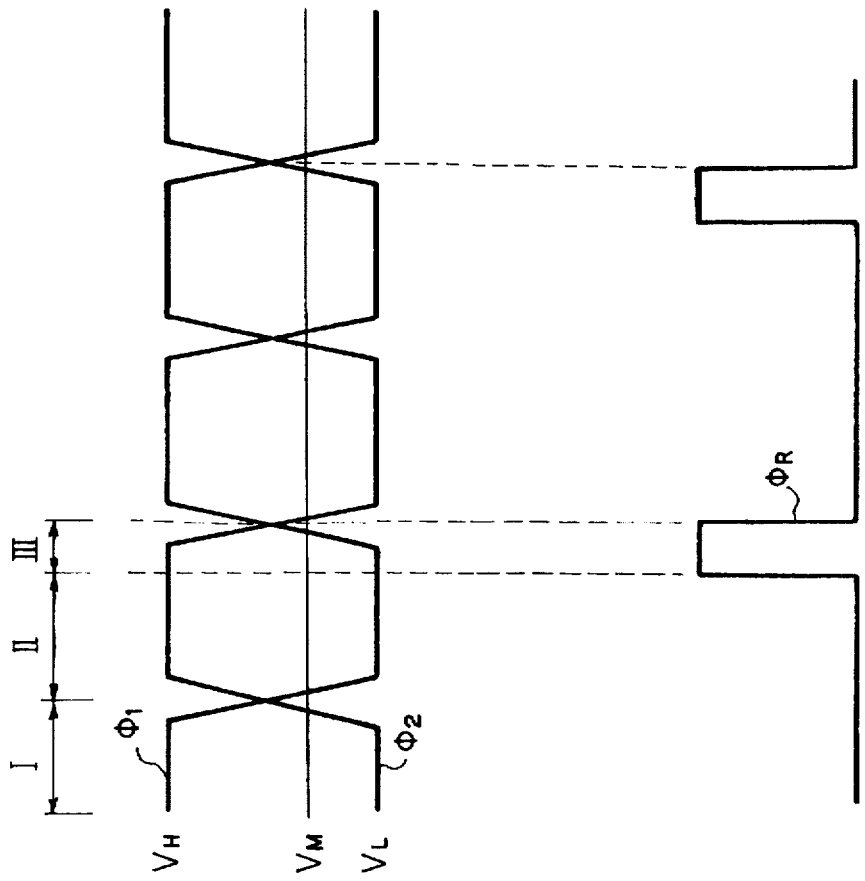
FIGS. 2A and 2B are timing diagrams showing the voltages applied to the device of FIGS. 1A and 1B.

The pulse voltages $\phi_1$ and $\phi_2$ are changed as shown in FIG. 2A to carry out a two-phase operation. In this case, $V_H$ is a high level of the pulse voltages $\phi_1$ and $\phi_2$ and $V_L$ is a low level of the pulse voltages $\phi_1$ and $\phi_2$. Also, the voltage $V_M$ applied to the electrodes E0 is between $V_H$ and $V_L$, and the electrodes E0 serve as nonactive barrier electrodes.

Further, the reset voltage $\phi_R$ applied to the electrode E3 is changed as shown in FIG. 2B. That is, the potential at the $N^+$-type semiconductor region 4 is the same as that at the $N^+$-type semiconductor region 6 at each two-phase operation.

Figures 3A, 3B, 3C:
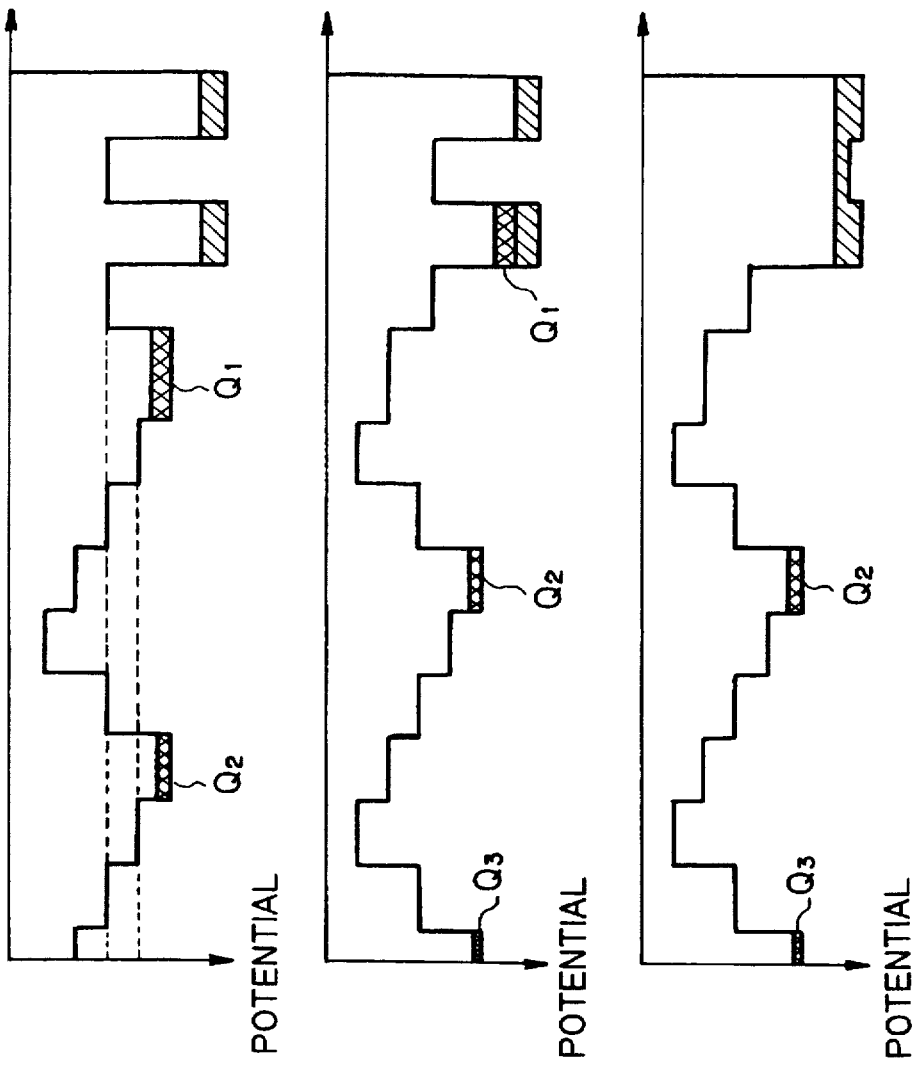
FIGS. 3A, 3B and 3C are potential diagrams for explaining the operation of the device of FIGS. 1A and 1B.

First, in a state I where the pulse voltages $\phi_1$ and $\phi_2$ are $V_H$ and $V_L$, respectively, the potential within the device is shown in FIG. 3A. That is, the potential wells within the regions 3-2, 2-2, 3-1 and 2-1 induced by the pulse voltages $\phi_1$ and $\phi_2$ are deeper in the direction of the signal flow. As a result, signal charge $Q_1$ is stored in the potential well of the N-type semiconductor region 2-1. Similarly, signal charge $Q_2$ is stored in the potential well of the N-type semiconductor region 2-3.

3

Next, the control enters a state II where the pulse voltages $\phi_1$ and $\phi_2$ are $V_L$ and $V_H$, respectively. The potential within the device is shown in FIG. 3B. That is, the potential wells within the regions 3-1, 2-1 and 4 are deeper in the direction of the signal flow. As a result, the signal charge $Q_1$ is transferred from the potential well of the N-type semiconductor region 2-1 to the potential well of the N-type semiconductor region 4. Similarly, the signal charge $Q_2$ is transferred from the potential well of the N-type semiconductor region 2-3 to the potential well of the N-type semiconductor region 2-2, and signal charge $Q_3$ is transferred from the potential well of the N-type semiconductor region 2-5 (not shown) to the potential well of the N-type semiconductor region 2-4. In this state, an impedance transformation is performed upon the signal charge $Q_1$ at the $N^+$-type semiconductor region (floating diffusion region) 4 by the source follower 8, to generate the output voltage $V_{out}$ represented by $$V_{out} = Q_1/C \cdot G$$

where C is a capacitance of the floating diffusion region 4, and G is a voltage gain of the source follower 8.

Next, the control enters a state III where the reset voltage $\phi_R$ is high, the potential at the $N^+$-type semiconductor region 4 is again the same as that at the $N^+$-type semiconductor region 6 to prepare for the detection of the next signal charge as shown in FIG. 3C.

The above-mentioned process is repeated to sequentially generate signal charges as the output voltage $V_{out}$.

In the above-described prior art buried channel charge coupled device, a width W' of the $N^+$-type semiconductor region (floating diffusion region) 4 is smaller than a width W of the semiconductor regions 3-1, 2-2, 3-2, 2-3, 3-3, . . . , to enhance the sensitivity of detection of signal charge. In this case, however, in order to obtain a full amount of signal charge in the direction of the signal flow, the maximum storage amount of charge by the shaded well S1 of the N-type semiconductor region 2-1 should be equalized with that by the shaded well S2 of the N-type semiconductor region 2-2. That is, the area of the shaded well S1 should be the same as that of the shaded well S2. As a result, the length L10 of the shaded well S1 is longer than the length L20 of the shaded well S2, and accordingly, the length L1 of the outermost electrode E1 is longer than the length L2 of the outermost electrode E2. That is,

L1>L2

This reduces the efficiency of transfer of charge in the direction of the signal flow.

Particularly, as shown in FIG. 4A, when the amount of signal charge A is small, the large length L10 of the shaded well S1 of the N-type semiconductor region 2-1 reduces the efficiency of transfer of charge in the direction of the signal flow. Note that, as shown in FIG. 4B, even when excess signal charge C in addition to large signal charge B is stored in the potential wells beneath the electrode E1 (L1), half of the signal charge C may be transferred in the opposite direction of the signal flow, which may adversely affect to the efficiency of transfer of charge in the direction of the signal flow.

Figures 5A, 5B:
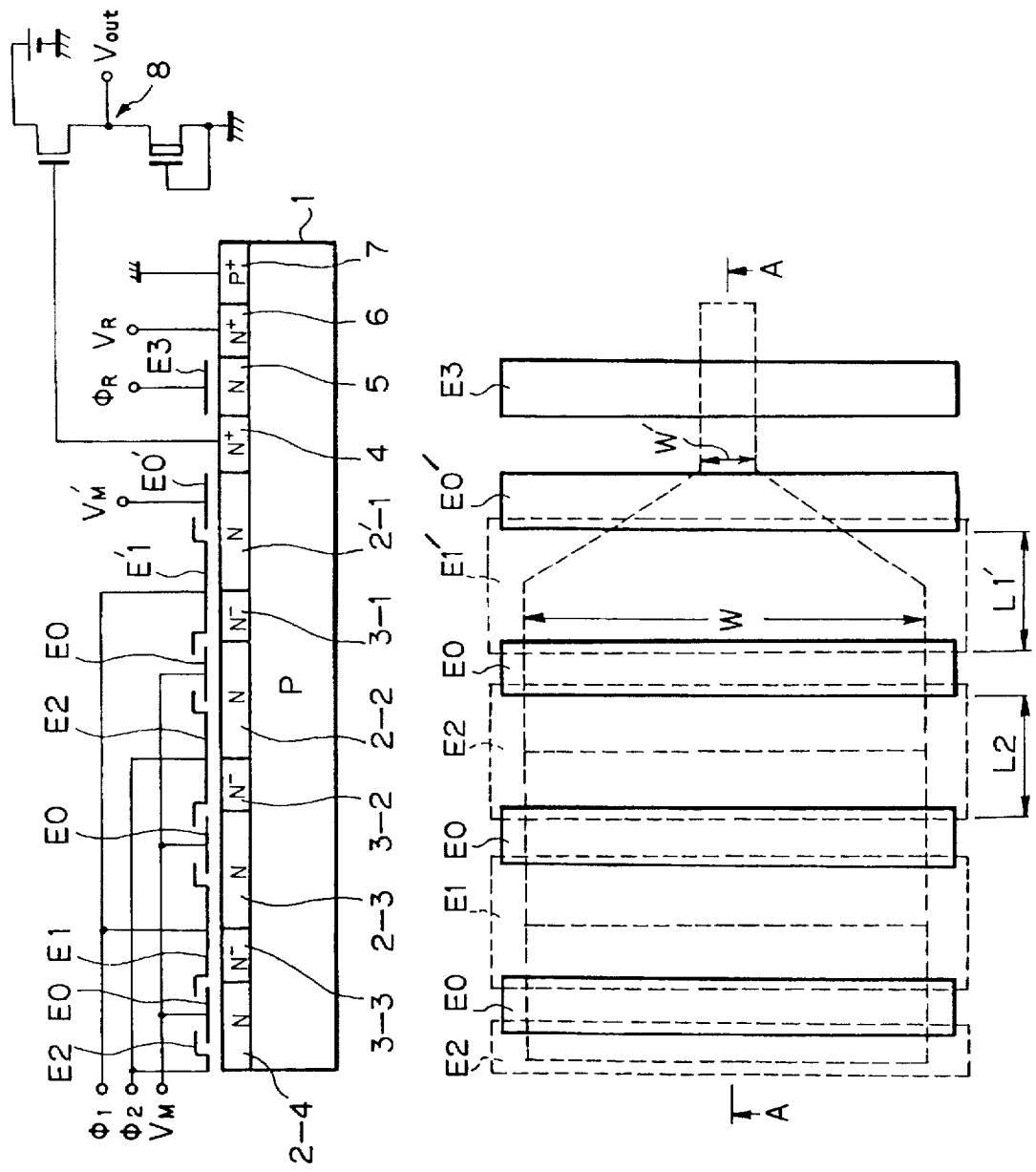
FIG. 5A is a cross-sectional view illustrating an embodiment of the charge coupled device according to the present invention.
FIG. 5B is a plan view of the device of FIG. 5A.

FIG. 5A is a cross-sectional view illustrating an embodiment of the charge coupled device according to the present invention, and FIG. 5B is a plan view of FIG. 5B. Note that FIG. 5A is a cross-sectional view taken along the line A—A of FIG. 5B. In FIGS. 5A and 5B, the outermost electrode of the electrodes E0 of FIGS. 1A and 1B denoted by E0' is electrically isolated from the other electrodes E0, and a voltage $V_M'$, which is different from the voltage $V_M$, is

4 applied to the electrode E0'. Also, the outermost N-type semiconductor region 2-1 of FIGS. 1A and 1B is replaced by an N-type semiconductor region 2'-1 whose length L2' is smaller than the length L1 of the outermost N-type semiconductor region 2-1 of FIGS. 1A and 1B, and accordingly, the outermost electrode E1 of FIGS. 1A and 1B is replaced by an electrode E1' whose length L1' is smaller than the length L1 of the electrode E1. For example, the length L1' of the electrode E1 is

L1'≈L2

In FIGS. 5A and 5B, the electrode E0' also serves as a nonactive barrier electrode. However, as shown in FIG. 6A, the voltage $V_M'$ applied to the electrode E0' is higher than the voltage $V_M$ applied to the electrodes E0, so that the potential well within the region 2'-1 beneath the electrode E0' is deeper than the potential well within the regions 2-2, 2-3, . . . . . beneath the electrodes E0.

The transfer operation of the device of FIGS. 5A and 5B is carried out by changing the pulse voltages $\phi_1$ and $\phi_2$ and the reset voltage $\phi_R$ as shown in FIGS. 6A and 6B.

Figure 7A:
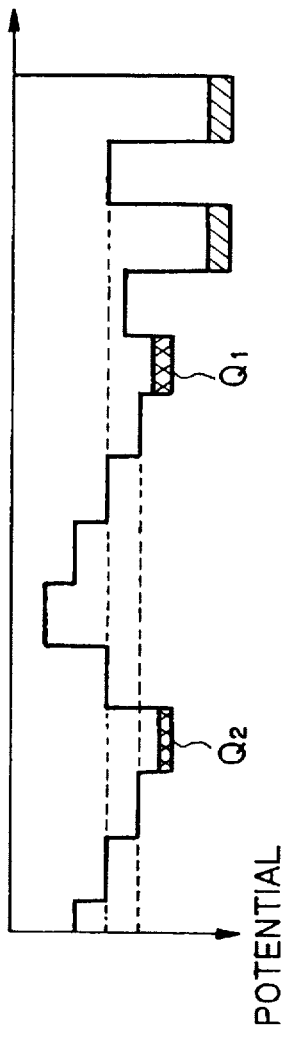
FIGS. 7A, 7B and 7C are potential diagrams for explaining the operation of the device of FIGS. 5A and 5B.

First, in a state I where the pulse voltages $\phi_1$ and $\phi_2$ are $V_H$ and $V_L$, respectively, the potential within the device is shown in FIG. 7A. That is, the potential wells within the regions 3-2, 2-2, 3-1 and 2'-1 induced by the pulse voltages $\phi_1$ and $\phi_2$ are deeper in the direction of the signal flow. As a result, signal charge $Q_1$ is stored in the potential well of the N-type semiconductor region 2-1. Similarly, signal charge $Q_2$ is stored in the potential well of the N-type semiconductor region 2-3.

Figure 7B:
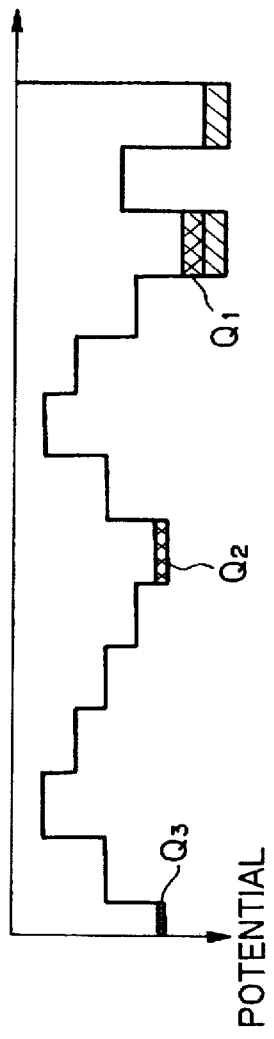

Next, the control enters a state II where the pulse voltages $\phi_1$ and $\phi_2$ are $V_L$ and $V_H$, respectively, the potential within the device is shown in FIG. 7B. That is, the potential wells within the regions 3-1, 2'-1 and 4 are deeper in the direction of the signal flow. As a result, the signal charge $Q_1$ is transferred from the potential well of the N-type semiconductor region 2-1 to the potential well of the N-type semiconductor region 4. In this case, since the length L1' of the electrode E1' can be reduced, the efficiency of transfer of charge can be enhanced. This will be explained later in detail. Similarly, the signal charge $Q_2$ is transferred from the potential well of the N-type semiconductor region 2-3 to the potential well of the N-type semiconductor region 2-2, and signal charge $Q_3$ is transferred from the potential well of the N-type semiconductor region 2-5 (not shown) to the potential well of the N-type semiconductor region 2-4. In this state, an impedance transformation is performed upon the signal charge $Q_1$ at the $N^+$-type semiconductor region (floating diffusion region) 4 by the source follower 8, to generate the output voltage $V_{out}$.

Figure 7C:
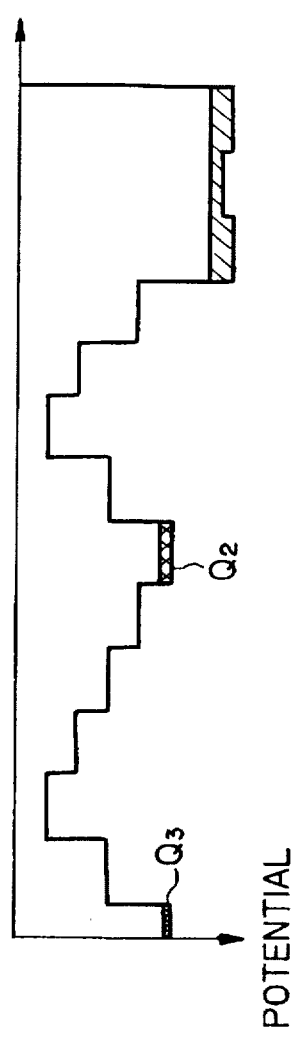

Next, the control enters a state III where the reset voltage $\phi_R$ is made high, the potential at the $N^+$-type semiconductor region 4 is again the same as that at the $N^+$-type semiconductor region 6 to prepare for the detection of the next signal charge as shown in FIG. 7C.

The above-mentioned process is repeated to sequentially generate signal charges as the output voltage $V_{out}$.

Figure 8A:
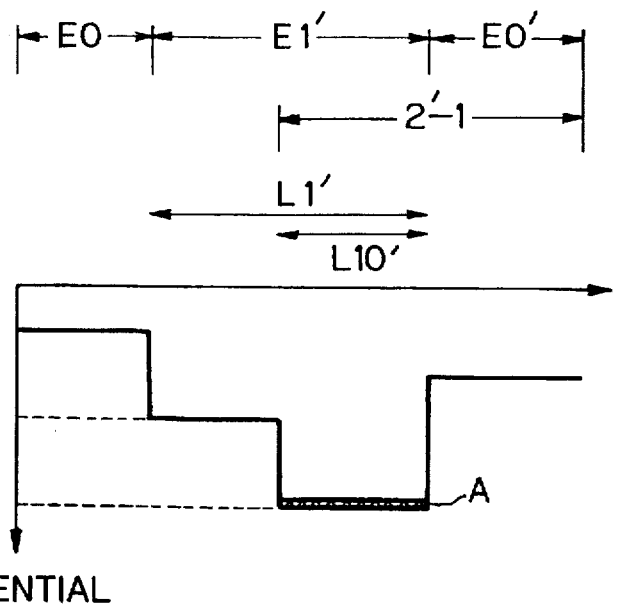
FIGS. 8A and 8B are enlarged potential diagrams of FIG. 7A.
Figure 8B:
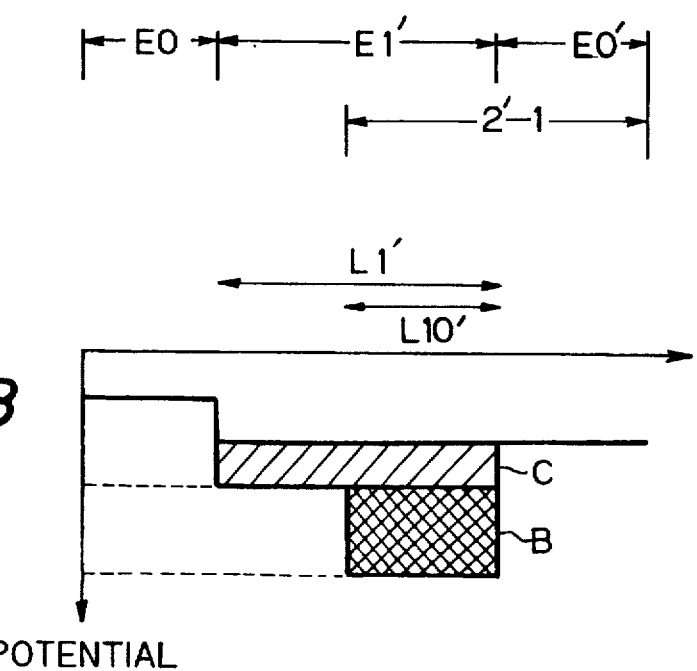

Particularly, as shown in FIG. 8A, when the amount of signal charge A is small, the small length L10' of the potential well of the N-type semiconductor region 2'-1 beneath the electrode E1' enhances the efficiency of transfer of charge in the direction of the signal flow. On the other hand, as shown in FIG. 8B, when excess signal charge C in addition to large signal charge B is stored in the potential wells beneath the electrode E1 (L1'), region 2'-1, all of the signal charge C may be transferred in the direction of the signal flow, since the potential well beneath the electrode E0' is deeper than the potential well beneath the electrode E0.

This contributes to the enhancement of the efficiency of transfer of charge in the direction of the signal flow.

In FIG. 5A, the regions 2'-1, 2-2, 2-3, 2-4, . . . are denoted by N, and the regions 3-1, 3-2, 3-3, . . . are denoted by N⁻. Note that, if the regions 2'-1, 2-2, 2-3, 2-4, . . . are denoted by N⁺, the regions 3-1, 3-2, 3-3, . . . can be denoted by N. That is, if the concentration of N-type impurity of the regions 2'-2, 2-2, 2-3, 2-4, . . . is larger than that of N-type impurity of the regions 3-1, 3-2, 3-3, 3-4, . . . , the direction of the signal flow can be determined.

Figure 9:
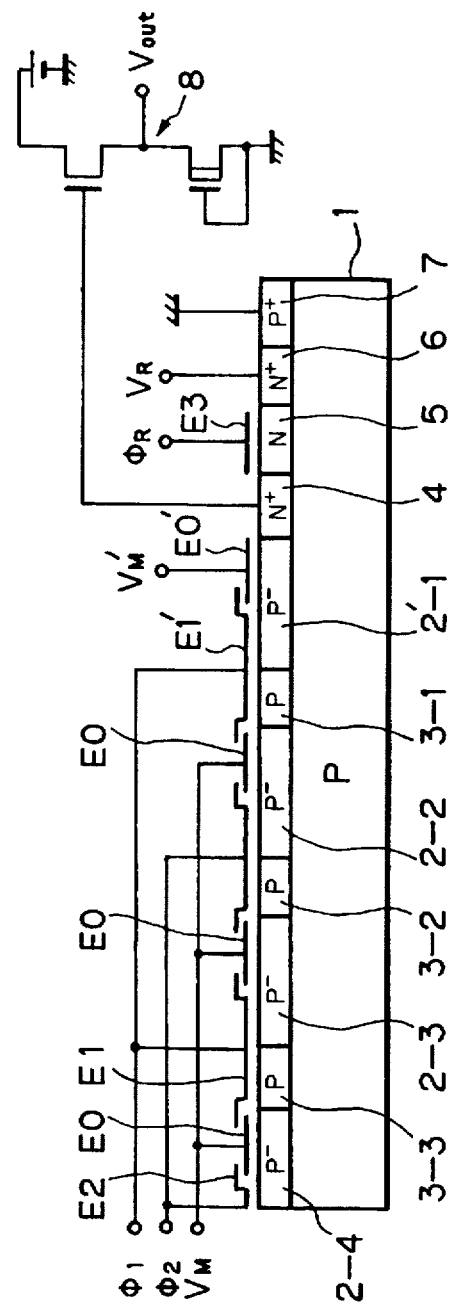
FIG. 9 is a cross-sectional view illustrating a modification of the device of FIG. 5A.

Also, the present invention can be applied to a surface channel charge coupled device as illustrated in FIG. 9. In this case, the regions 2'-1, 2-2, 2-3, 2-4, . . . , and 3-1, 3-2, 3-3, 3-4, . . . are of a P-type. Further, the concentration of P-type impurity of the regions 2'-2, 2-2, 2-3, 2-4, . . . is smaller than that of P-type impurity of the regions 3-1, 3-2, 3-3, 3-4, . . . , the direction of the signal flow can be determined.

Further, the present invention can be applied to a P-channel type buried channel charge coupled device as illustrated in FIG. 10, where the polarity of conductivity is reversed, so that holes are transferred. In this case, the pulse voltages $\phi_1$ and $\phi_2$ and the reset voltage $\phi_R$ are changed as shown in FIGS. 11A and 11B.

As explained hereinabove, according to the present invention, since the direction of the signal flow can be clearly determined and the length of the outermost electrode can be reduced, the efficiency of transfer of charge can be enhanced.

I claim:

1. A charge coupled device comprising:
   a semiconductor substrate;
   a plurality of first semiconductor regions formed on said semiconductor substrate, each of said first semiconductor regions having a first part and a second part;
   a plurality of second semiconductor regions formed on said semiconductor substrate, each of said second semiconductor regions being arranged between two adjacent ones of said first semiconductor regions,
   a third semiconductor region formed on said semiconductor substrate and adjacent to an outermost one of said first semiconductor regions;
   a plurality of first electrodes, each of said first electrodes formed over said first part of one of said first semiconductor regions; and
   a plurality of second electrodes, each of said second electrodes formed over said second part of one of said first semiconductor regions and one of said second semiconductor regions, wherein, in a pair of said second electrodes, a first voltage operates one of the pair of second electrodes and a second voltage, of opposite phase to said first voltage, operates the other of the pair of second electrodes
   an outermost one of said first electrodes being electrically isolated from others of said first electrodes, the others of said first electrodes being connected to each other.

2. The device as set forth in claim 1, wherein a first voltage is applied to the outermost one of said first electrodes and a second voltage different from said first voltage is applied to the others of said first electrodes, so that a potential well within said first semiconductor regions beneath the outermost one of said first electrodes is deeper than potential wells within said first semiconductor regions beneath the others of said first electrodes.

3. The device as set forth in claim 1, wherein conductivity types of said first, second and third semiconductor regions are opposite to a conductivity type of said semiconductor substrate.

4. The device as set forth in claim 1, wherein conductivity types of said first and second semiconductor regions are the same as a conductivity type of said semiconductor substrate, and a conductivity type of said third semiconductor region is opposite to the conductivity type of said semiconductor substrate.

5. A charge coupled device, comprising:
   a semiconductor substrate having a semiconductor region thereon;
   a plurality of first electrodes formed over said semiconductor region;
   a plurality of second electrodes formed over said semiconductor region, each of said second electrodes being arranged between two of said first electrodes; and
   a plurality of third electrodes formed over said semiconductor region, each of said third electrodes being arranged between two of said first electrodes, and between two of said second electrodes,
   an outermost one of said first electrodes being electrically isolated from others of said first electrodes, the others of said first electrodes being connected to each other, wherein said second and third electrodes are operated by two opposite phase voltages.

6. The device as set forth in claim 5, wherein a first voltage is applied to the outermost one of said first electrodes and a second voltage different from said first voltage is applied to the others of said first electrodes, so that a potential well within said semiconductor region beneath the outermost one of said first electrodes is deeper than potential wells within said semiconductor region beneath the others of said first electrodes.

7. The device as set forth in claim 6, wherein said first electrodes are nonactive barrier electrodes, said nonactive barrier electrodes receiving voltages such that said semiconductor regions beneath said first electrodes pass signal charge therethrough and store no signal charge.

8. The device as set forth in claim 5, wherein a conductivity type of said semiconductor region is opposite to a conductivity type of said semiconductor substrate.

9. The device as set forth in claim 5, wherein a conductivity type of said semiconductor region is the same as a conductivity type of said semiconductor substrate.

10. The device as set forth in claim 5, wherein said first electrodes are nonactive barrier electrodes, said nonactive barrier electrodes receiving voltages such that said semiconductor regions beneath said first electrodes pass signal charge therethrough and store no signal charge.

* * * * *